US 6,629,882 B2

(12) United States Patent
Takahashi et al.

(10) Patent No.: US 6,629,882 B2
(45) Date of Patent: Oct. 7, 2003

(54) PRECISE POLISHING APPARATUS AND METHOD

(75) Inventors: Kazuo Takahashi, Kawasaki (JP); Mikichi Ban, Miura (JP); Matsuomi Nishimura, Omiya (JP); Shinzo Uchiyama, Utsunomiya (JP); Takashi Kamono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 09/970,302

(22) Filed: Oct. 4, 2001

(65) Prior Publication Data

US 2002/0019204 A1 Feb. 14, 2002

Related U.S. Application Data

(62) Division of application No. 09/044,147, filed on Mar. 19, 1998.

(30) Foreign Application Priority Data

Mar. 21, 1997 (JP) ............................................. 9-068150
Mar. 17, 1998 (JP) ........................................... 10-066855

(51) Int. Cl.[7] .............................................. B24B 29/00
(52) U.S. Cl. ......................................... 451/286; 451/60
(58) Field of Search .................................. 451/285, 286, 451/287, 288, 289, 290, 60, 41

(56) References Cited

U.S. PATENT DOCUMENTS

| | | |
|---|---|---|
| 4,663,890 A | 5/1987 | Brandt |
| 4,693,036 A | 9/1987 | Mori |
| 4,842,354 A | 6/1989 | Takahashi et al. |
| 5,113,280 A | 5/1992 | Kawasaki et al. |
| 5,554,064 A | 9/1996 | Breivogel et al. |
| 5,582,534 A | 12/1996 | Shendon et al. |
| 5,643,406 A | 7/1997 | Shimomura et al. |
| 5,702,291 A | 12/1997 | Isobe |
| 5,769,697 A | 6/1998 | Nishio |
| 5,782,675 A | 7/1998 | Southwick |
| 5,787,595 A | 8/1998 | Desai et al. |
| 5,820,448 A | 10/1998 | Shamouilian et al. |
| 5,851,136 A | 12/1998 | Lee |
| 5,866,480 A | 2/1999 | Murakami et al. |
| 5,904,611 A | 5/1999 | Takahashi et al. |
| 5,908,530 A | 6/1999 | Hoshizaki et al. |
| 5,931,722 A * | 8/1999 | Ohmi et al. ................. 451/271 |
| 6,004,187 A | 12/1999 | Nyui et al. |
| 6,012,966 A | 1/2000 | Ban et al. |
| 6,179,695 B1 | 1/2001 | Takahashi et al. |
| 6,299,506 B2 | 10/2001 | Nishimura et al. |

FOREIGN PATENT DOCUMENTS

| | | |
|---|---|---|
| JP | 59-19671 | 2/1984 |
| JP | 63-256356 | 4/1987 |
| JP | 62-136366 | 6/1987 |
| JP | 57-41165 | 3/1992 |
| JP | 5-285825 | 11/1993 |
| JP | 8-316179 | 11/1996 |
| JP | 9-186117 | 7/1997 |
| SU | 1386431 | 4/1988 |

* cited by examiner

Primary Examiner—Dung Van Nguyen
(74) Attorney, Agent, or Firm—Fitzpatrick, Cella, Harper & Scinto

(57) ABSTRACT

The present invention provides a precise polishing apparatus and method in which a polished body is polished by rotating a polishing pad having a diameter greater than that of the polished body while urging the polishing pad against the polished body in conditions that a center of the polished body is deviated from a rotation axis of the polishing pad and that the polishing pad is contacted with the entire polished surface of the polished body. The polished body may be a semi-conductor wafer.

48 Claims, 11 Drawing Sheets

PRECISE POLISHING APPARATUS AND METHOD

This is a divisional application of application Ser. No. 09/044,147, filed on Mar. 19, 1998.

BACKGROUND OF THE INVENTION

1. Field of the Invention

The present invention relates to a precise polishing apparatus and a precise polishing method for polishing a substrate such as a wafer with high accuracy.

2. Related Background Art

Recently, fine arrangement and multi-layer wiring of semi-conductor devices have been progressed and, thus, there has been requested to provide precise polishing apparatuses for flattening a surface of a substrate such as a semi-conductor wafer made of Si, GaAs, InP or SOI with high accuracy. Among them, as a precise polishing apparatus for accurately flattening the surface of the substrate such as a wafer on which semi-conductor elements are formed, a chemical mechanical polishing (CMP) apparatus is known.

Conventional CMP apparatuses can be divided into two types shown in FIGS. 10 and 11.

(1) FIG. 10 is a schematic view of a polishing work portion of the CMP apparatus in which the polishing (abrasion) is effected with a polished surface of a wafer 100 facing downwardly.

As shown in FIG. 10, the wafer 100 is held with the polished surface (surface to be polished) thereof facing downwardly, and the wafer 100 is polished by urging the wafer against a polishing pad 802 having a diameter larger than that of the wafer while rotating the wafer. During the polishing, abrasive agent (slurry) is supplied onto the polishing pad 802.

In the apparatus of this kind, as methods for holding the wafer onto a wafer chuck 801, vacuum suction or adhesion by using wax, solution or pure water has been adopted, and, in some cases, a guide ring (not shown) is provided on a periphery of the wafer 100 to prevent deviation of the wafer 100. The diameter of the polishing pad 802 on a polishing table 806 is greater than that of the wafer 100 by 3 to 5 times, and suspension obtained by mixing fine powder of silicon oxide with solution of potassium hydroxide is used as the slurry.

(2) On the other hand, as shown in FIG. 11, there has been proposed a technique in which a wafer 100 is held on a wafer chuck 901 having a guide ring (not shown) and disposed on a wafer table 906 with a polished surface thereof facing upwardly and the wafer 100 is polished by using a polishing pad 802 having a diameter smaller than that of the wafer 100.

In such polishing apparatus and method, the substrate such as the present semi-conductor wafer having a diameter of eight inches can be polished exclusively. However, recently, since fine arrangement of semi-conductor integrated circuits and large diameter wafers have been proposed, it is guessed that the wafer having 8-inch diameter will be replaced by a wafer having 12-inch diameter in the near future.

In order to polish the large diameter wafer, there arise the following problems in the conventional techniques.

In the conventional polishing apparatuses, although the polishing ability is adjusted by making a thickness and elasticity of the polishing pad optimum to polish the 8-inch wafer, in this case, it is difficult to ensure fine adjustment and uniformity of material of the polishing pad and, thus, it is very difficult to polish the large diameter wafer such as 12-inch wafer with high accuracy.

For example, in the conventional polishing methods, it is difficult to obtain a uniform polished amount through the entire surface of the wafer by using the polishing pad having the diameter smaller than that of the wafer. Further, if the entire polished surface of the wafer is polished by the polishing pad having the diameter smaller than that of the wafer, the polishing time will be increased considerably. Further, if the wafer is polished at once by using the polishing pad having the diameter greater than that of the wafer by twice or more, the polished amount near outer periphery of the polishing pad will become greater than the polished amount near a rotational center of the polishing pad due to difference in peripheral speed between the rotational center of the polishing pad and the outer periphery of the polishing pad.

In addition, the polishing pad may be abraded or deformed into a donut shape since a part of the polishing pad is only in contact with the wafer. The polishing pad is applied with a pressure when it polishes the wafer and the polishing pad may be deformed due to the pressure. Such matters may affect the uniformness and the flatness of the polished surface.

Further, as is in the conventional cases, when the wafer with the polished surface thereof facing downwardly is polished by opposing the polishing pad having the diameter greater than that of the wafer by twice or more to the wafer, the abrasive agent is continued to be supplied to not only an area of the polishing pad with which the wafer is contacted but also the entire area of the polishing pad. As a result, a large amount of abrasive agent is consumed, thereby making the polishing expensive.

SUMMARY OF THE INVENTION

An object of the present invention is to eliminate the above-mentioned conventional drawbacks.

To achieve the above object, according to the present invention, there is provided a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polishing is effected in conditions that a rotation axis of the polished body is deviated from a rotation axis of the polishing pad and that the polishing pad is contacted with an entire area of the polished surface of the polished body.

The present invention further provides a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polished body holding means includes a drive means for oscillating the polished body in directions along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polishing head includes a drive means for oscillating the polished body in directions along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polishing is effected in conditions that a rotation axis of the polished body is deviated from a rotation axis of the polishing pad and that the polishing pad is contacted with an entire area of the polished surface of the polished body.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polished body is oscillated along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating the polishing pad around a center of the polishing surface, and a supply opening provided in the polishing head and adapted to supply abrasive agent to the polished surface via the polishing pad, and wherein the polishing pad is oscillated along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polishing is effected in conditions that a rotation axis of the polished body is deviated from a rotation axis of the polishing pad and that the polishing pad is contacted with an entire area of the polished surface of the polished body.

The present invention further provides a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polished body holding means includes a drive means for oscillating the polished body in directions along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polishing head includes a drive means for oscillating the polished body in directions along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polishing is effected in conditions that a rotation axis of the polished body is deviated from a rotation axis of the polishing pad and that the polishing pad is contacted with an entire area of the polished surface of the polished body.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polished body is oscillated along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, and wherein the polishing pad is oscillated along the polished surface, and a sum of a maximum value of a distance between the center of the polished surface and the center of the polishing surface of the polishing pad generated due to the oscillation and a radius of the polished body is selected to become smaller than a radius of the polishing pad.

The present invention can uniformly polish the polished body by providing the above-mentioned polishing apparatus or method.

In the precise polishing apparatus, the polished body may comprise a semi-conductor wafer.

In the precise polishing apparatus, the polished body holding means may include an equalizing mechanism for urging the polished body against the polishing pad with uniform pressure. As a result, polishing unevenness due to uneven pressurization can be prevented.

In the precise polishing apparatus, a ratio between the number of rotations of the polished body and the number of rotations of the polishing pad may be selected within a range of 1:0.5 to 1.5.

In the precise polishing apparatus, the number of rotations of the polished body and the number of rotations of the polishing pad may be equal.

In the precise polishing apparatus, the diameter of the polishing pad may be smaller than twice of the diameter of the polished body.

In the precise polishing apparatus, the oscillation may be a reciprocal linear movement.

In the precise polishing apparatus, the oscillation may be a reciprocal arc movement. As a result, unevenness in a peripheral speed of oscillation sliding, thereby polishing the polished body uniformly.

Further, the present invention can uniformly polish the polished body by providing the following polishing apparatus or method.

That is to say, the present invention further provides a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polishing is effected in conditions that a rotation axis of the polished body is deviated from an axis of the polishing pad and that the polishing pad is contacted with an entire area of the polished surface of the polished body.

The present invention further provides a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polished body holding means includes a drive means for oscillating the polished body in directions along the polished surface, and a sum of a maximum value of a distance between the center of the polished body and the center of the polishing pad generated due to the oscillation and a radius of the polished body is selected to become smaller than a radius of the polishing pad.

The present invention further provides a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polishing head includes a drive means for oscillating the polished body in directions along the polished surface, and a sum of a maximum value of a distance between the center of the polished body and the center of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polishing is effected in conditions that a rotation axis of the polished body is deviated from an axis of the polishing pad and that the polishing pad is contacted with an entire area of the polished surface of the polished body.

The present invention further provides a precise polishing method using a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polished body is oscillated along the polished surface, and a sum of a maximum value of a distance between the center of the polished body and the center of the polishing pad generated due to the oscillation and a radius of the polished body is selected to become smaller than a radius of the polishing pad.

The present invention further provides a precise polishing method using a precise polishing apparatus comprising polished body holding means for holding a polished body with a polished surface thereof facing upwardly and for rotating and revolving the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, and wherein the polishing pad is oscillated along the polished surface, and a sum of a maximum value of a distance between the center of the polished body and the center of the polishing pad generated due to the oscillation and a radius of the polished body is selected to become smaller than a radius of the polishing pad.

In the precise polishing apparatus, the polished body may comprise a semi-conductor wafer.

In the precise polishing apparatus, the polished body holding means may include an equalizing mechanism for urging the polished body against the polishing pad with uniform pressure.

In the precise polishing apparatus, a drive means for rotating the polishing pad is provided, and a ratio between the number of rotations of the polished body and the number of rotations of the polishing pad may be selected within a range of 1:0.5 to 1.5.

In the precise polishing apparatus, a drive means for rotating the polishing pad is provided, and the number of rotations of the polished body and the number of rotations of the polishing pad may be equal.

In the precise polishing apparatus, the diameter of the polishing pad may be smaller than twice of the diameter of the polished body.

In the precise polishing apparatus, the oscillation may be a reciprocal linear movement.

In the precise polishing apparatus, the oscillation may be a reciprocal arc movement.

In the precise polishing apparatus, there may be provided a distance measuring means for measuring a distance between the polishing pad and the polished body which are opposed to each other. With this arrangement, the rotating polished body can be prevented from escaping.

In the precise polishing apparatus, there may be provided a drive means for rotating the polishing head in a direction opposite to the rotational direction of the polishing head.

In the precise polishing apparatus, a sum of a distance between the center of the polishing pad and the center of the polished body and a radius of the polished body may be selected to become smaller than a radius of the polishing pad. With this arrangement, the polished body can be polished uniformly.

In the precise polishing apparatus, the supply opening may be positioned at an end of a slurry supply passage passing through the rotational axis of the polishing head.

In the precise polishing apparatus, there may be provided a rotary joint for connecting a first slurry supply tube disposed in the slurry supply passage with a second slurry supply tube connected to a slurry supply tank.

In the precise polishing apparatus, the slurry supply passage passing through the rotational axis of the polishing head may extend through a revolution body for revolving the polishing head. With this arrangement, the slurry can be supplied stable for a long time.

In the precise polishing apparatus, a diameter of the polished body holding means may be greater than the diameter of the polishing pad.

In the precise polishing apparatus, the polished body holding means may hold the polished body in such a manner that the center of the polished body is deviated from a center of the polished body holding means.

In the precise polishing apparatus, a sum of a maximum distance between the center of the polishing pad and the center of said polished body holding means and a radius of the polishing pad is selected to become smaller than a radius of guide ring which is a part of said polished body holding means. With this arrangement, a thickness of the polishing pad can be maintained uniformly during the polishing.

In the precise polishing method, the rotational direction and the revolving direction of the rotating and revolving polishing pad may be opposite to each other. With this arrangement, the polished body can be polished uniformly.

In the precise polishing method, the polishing pad may be disposed above and opposed to the rotating polished body with a gap having a value of a half of the thickness of the polished body, and the polishing pad may be contacted with the polished body after acceleration of rotation of the polished body is stopped to rotate the polished body at a constant speed. With this arrangement, the rotating polished body can be prevented from escaping.

In the precise polishing method, a sum of a distance between the center of the polishing pad and the center of the polished body and a radius of the polished body may be selected to become smaller than a radius of the polishing pad. With this arrangement, the polished body can be polished uniformly.

In the precise polishing method, the entire surface of the polishing pad may be urged against the polishing body holding means holding the polished body to polish the polished body by the polishing pad.

In the precise polishing method, the polished body holding means may hold the polished body in such a manner that the center of the polished body is deviated from a center of the polished body holding means.

In the precise polishing method, a maximum sum of a distance between the center of the polishing pad and the center of said holding means and a radius of the polishing pad is selected to become smaller than a radius of guide ring which is a part of said polished body holding means. With this arrangement, a thickness of the polishing pad can be maintained uniformly during the polishing and the polished body can be polished uniformly.

A further object of the present invention is to provide a precise polishing method in which a direction of rotation of said polishing pad is opposite to a direction of revolution of said polishing pad.

DETAILED DESCRIPTION OF THE PREFERRED EMBODIMENTS

The present invention will now be explained in connection with embodiments thereof with reference to the accompanying drawings.

[First Embodiment]

Figure 1:
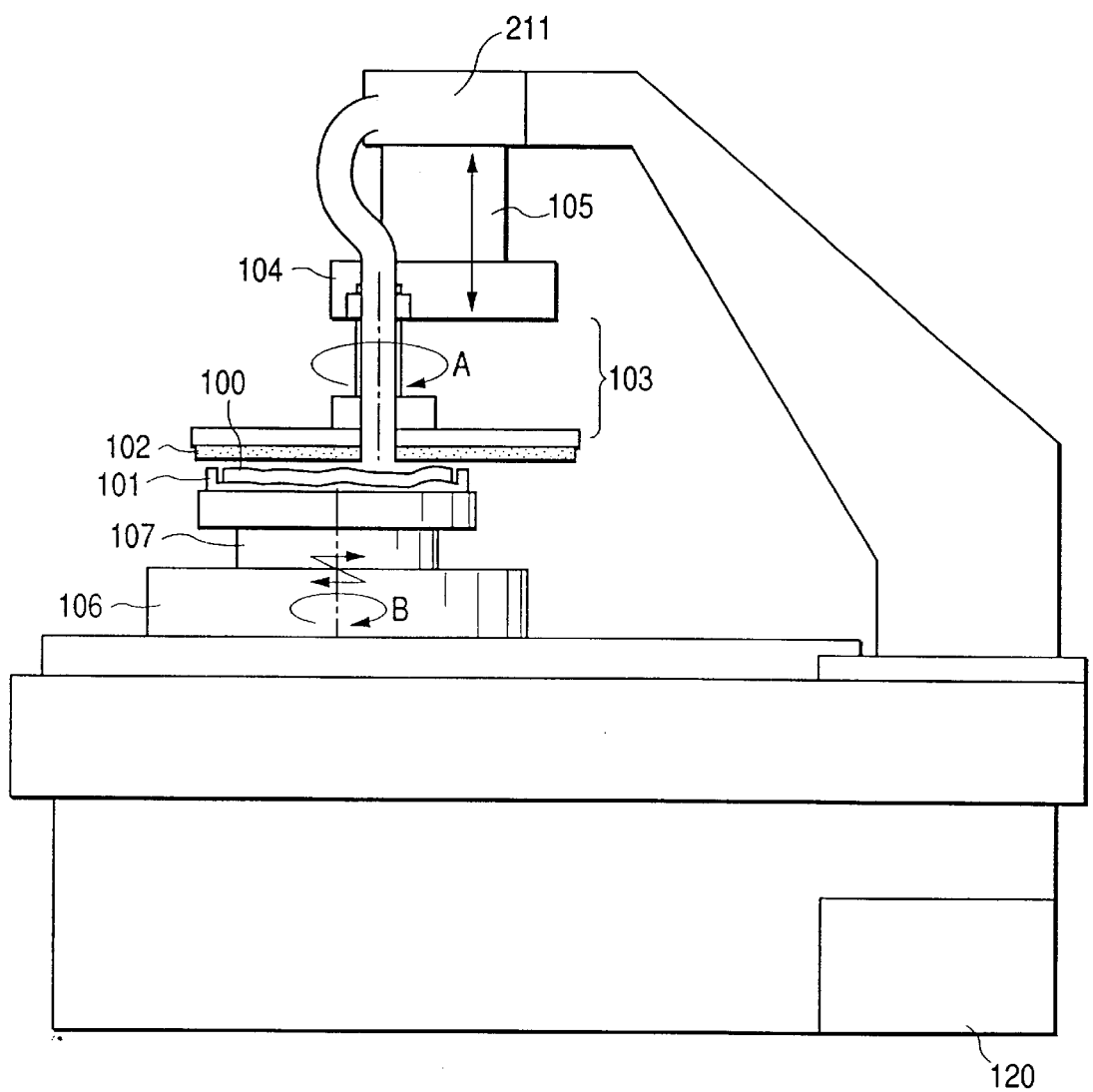
FIG. 1 is a schematic side view of a chemical mechanical polishing apparatus according to a first embodiment of the present invention.

FIG. 1 is a schematic side view of a precise polishing apparatus according to a first embodiment of the present invention. In the apparatus according to the first embodiment, a wafer 100 is held on a wafer chuck 101 with a polished surface thereof facing downwardly. The wafer chuck 101 has a backing film for holding a rear surface of the wafer 100 and a guide ring for surrounding the wafer 100. By rotating a polishing pad 102 having a diameter greater than a diameter of the wafer 100 and smaller than twice the diameter of the wafer 100, the wafer 100 is polished. The polishing pad 102 is attached to a platen of a polishing head 103 and is rotated around its axis in a direction shown by the arrow A by a first drive means 104.

The polishing head 103 is shifted in a vertical direction by a head lift/lower mechanism 105 so that the polishing pad 102 can be urged against the wafer 100. A wafer table 106 is rotated around its axis in a direction shown by the arrow B by a second drive means 208 which will be described later. The wafer 100 can be oscillated by a third drive means 209. In this apparatus, a rotation axis of the polishing pad 102 is deviated from a rotation axis of the wafer 100 so that these axes are not aligned with each other (i.e., these axes are situated at different positions), and the polishing pad and the wafer are positioned so that the entire surface of the wafer 100 does not project out of the polishing pad 102. The oscillation of the wafer 100 is also effected in such a manner that the entire surface of the wafer 100 does not project out of the polishing pad 102. That is to say, the polishing is effected in such a manner that the polishing pad 102 is always contacted with the entire surface of the wafer 100. To this end, in the illustrated embodiment, the rotation axes are positioned so that a sum of a distance between the rotation axis of the pad and the rotation axis of the wafer and a radius of the wafer 100 becomes smaller than a radius of the pad 102. When the wafer 100 is oscillated, the oscillation range may be selected so that a sum of a maximum distance between the rotation axes generated due to the oscillation and the radius of the wafer becomes smaller than the radius of the pad. The wafer table 106 is provided with an equalizing mechanism 107 for urging the entire surface against the polishing pad 102 with uniform pressure during the contact between the pad and the wafer.

Incidentally, the oscillation described in the illustrated embodiment includes reciprocal linear movement and a reciprocal arc movement.

The precise polishing apparatus according to the present invention includes a control means 120 which controls the first drive means 104, head lift/lower mechanism 105, second drive means 208 (described later) and third drive means 209 independently and which is constituted by a microcomputer or the like.

Figure 2:
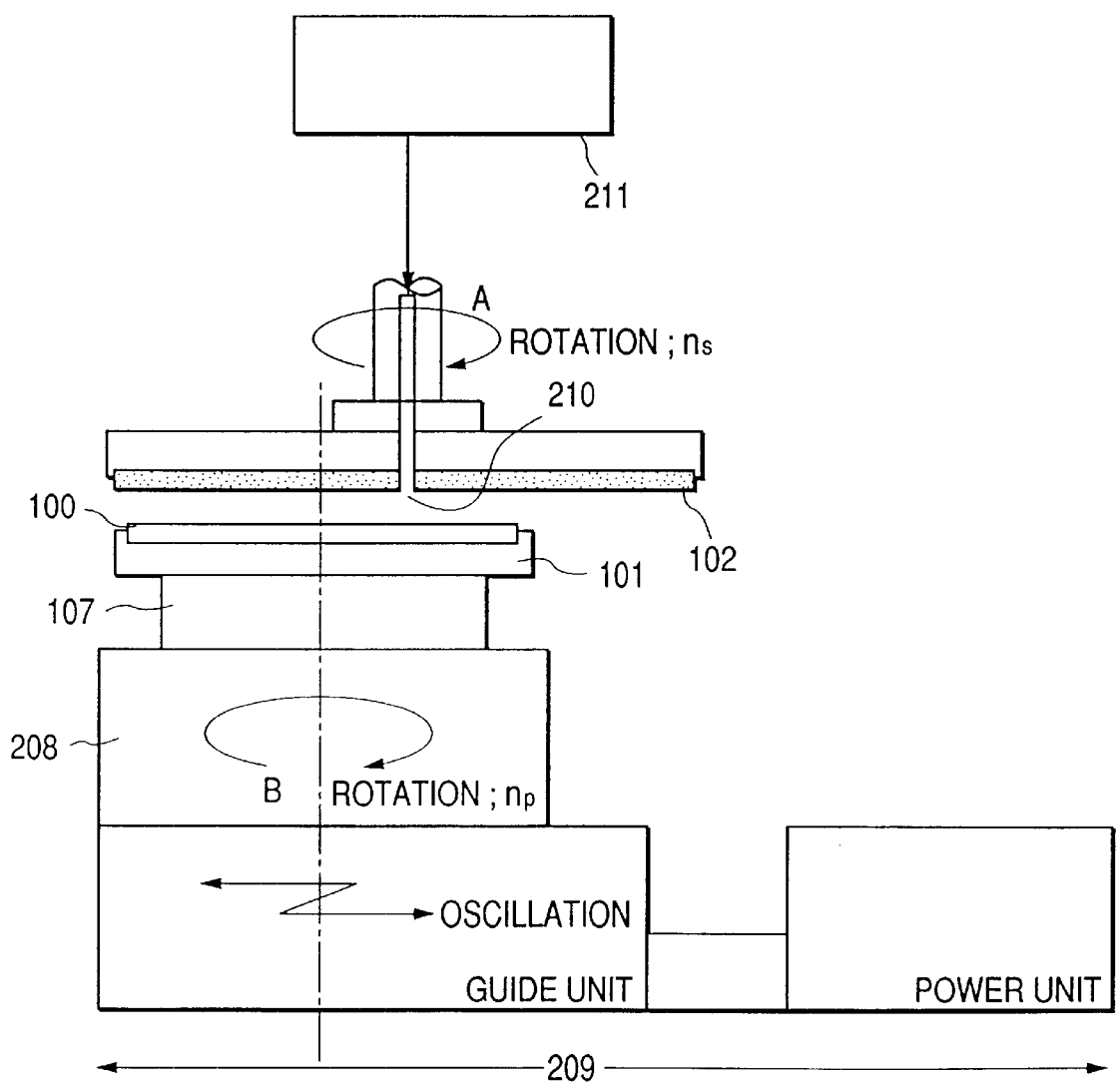
FIG. 2 is a schematic side view showing a wafer chuck and a drive means therefor.

FIG. 2 is a schematic view showing a driving device for driving the wafer chuck 101 provided on the wafer table 106 according to the first embodiment of the present invention. The wafer chuck 101 is rotated around its axis in a direction shown by the arrow B by the second drive means 208. The third drive means 209 is constituted by a guide unit and a power unit to oscillate the wafer chuck 101 horizontally.

In place of the fact that the wafer 100 is oscillated by the arrangement shown in FIG. 2, the third drive means 209 may be provided on the head to oscillate the head, or, both the wafer and the head may be oscillated. In any cases, it is designed so that the entire surface of the wafer 100 does not project out of the polishing pad 102.

The platen and the polishing pad 102 are provided with a small hole 210 so that abrasive agent or liquid such as pure water supplied from an abrasive agent supply mechanism 211 is dropped onto the wafer from the small hole 210 (as a supply opening) through a conduit passing through the polishing pad 102. When the polishing pad 102 is made of material such as clutch for permitting the passage of the abrasive agent or such as polyurethane having great communication holes, the small hole 210 may be omitted from the polishing pad 102.

The abrasive agent used in the present invention may be obtained by dispersing fine particles (having relatively uniform diameter of the order of several millimeters or submicrons) of manganese dioxide, silicon oxide, cerium oxide, aluminum oxide, zeolite, oxide, chrome oxide, iron oxide, silicon carbide, boron carbide, carbon or ammonium salt into solution of sodium hydroxide, potassium hydroxide, ammonia, isocyanic acid, Br—CH$_3$OH or hydrochloric acid. However, the combination of the particles and the solution may be selected appropriately in accordance with the purpose. For example, when the surface of Si (silicon) is polished, abrasive agent obtained by dispersing fine particles of silicon oxide, cerium oxide, ammonium salt or manganese dioxide into the above-mentioned solution can be used suitably, and, when the surface of SiO$_2$ is polished, abrasive agent obtained by dispersing fine particles of silicon oxide into solution of potassium hydroxide can be used suitably and, when the surface of aluminum is polished, abrasive agent obtained by dispersing fine particles of silicon oxide into solution of ammonia including hydrogen peroxide can be used suitably. Further, a polished body polished by the precise polishing apparatus according to the present invention may be a semi-conductor wafer made of silicon or gallium arsenide, or a wafer including at least one material constituting a semi-conductor element such as transistor. As other polished bodies, SOI substrate or display substrate may be used.

Next, a polishing method will be described.

There are two polishing methods. In the first polishing method, the wafer 100 and the polishing pad 102 are rotated in the same direction by the same number of rotations and, in the second polishing method, the number of rotations of the wafer differs from that of the polishing pad. Both methods are preferable. When the same number of rotations is used, the number of rotations of the wafer 100 and the polishing pad 102 is selected within a range of 1000 rpm or less (same direction), and more preferably, 50 to 300 rpm (same direction).

When the number of rotations of the wafer differs from that of the polishing pad, a ratio between the number of rotations of the wafer 100 and the number of rotations of the polishing pad 102 is selected within a range of 1:0.5 to 1.5, and the number of rotations of the polishing pad 102 can be selected to become smaller than 1000 rpm. Also in this case, the wafer and the pad are preferably rotated in the same direction, and more preferably, in addition to the rotation, the wafer 100 or the pad 102 is oscillated.

Figure 5:
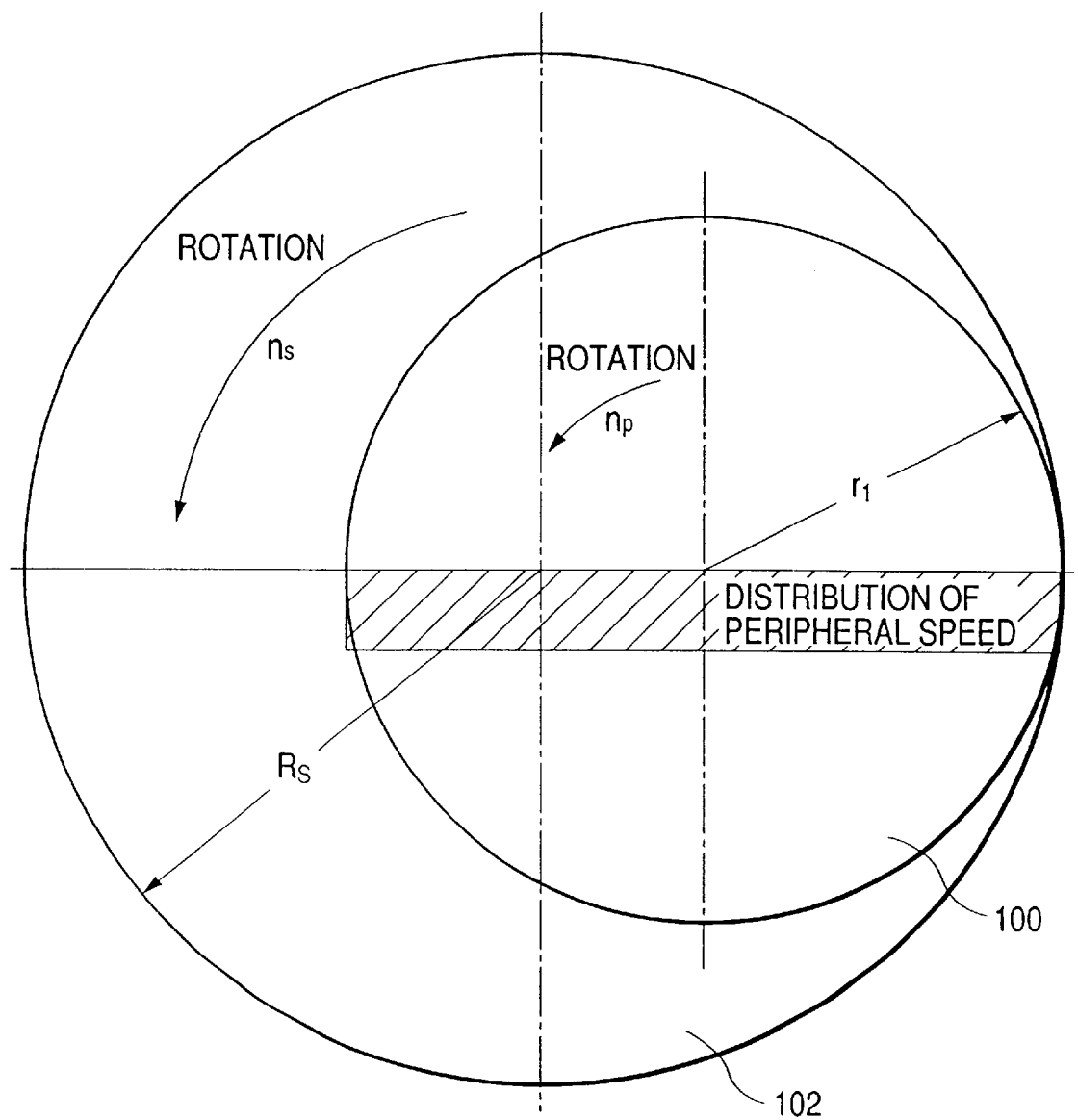
FIG. 5 is a view for explaining a peripheral speed of a surface of a wafer.

As shown in FIG. 5, by equalizing the number $n_p$ of rotations of the wafer 100 to the number $n_s$ of rotations of the polishing pad 102 in this way, a relative peripheral speed can be made uniform at any position on a polished surface of the wafer 100.

The pressure (obtained by the head lift/lower mechanism 105) for urging the polishing pad 102 against the wafer 100 is 0 to 1 kg/cm$^2$.

In addition to the rotations of the wafer 100 and the polishing pad 102, by oscillating the wafer chuck 101 by means of the third drive means 209, the polishing can be effected more accurately.

Figure 3:
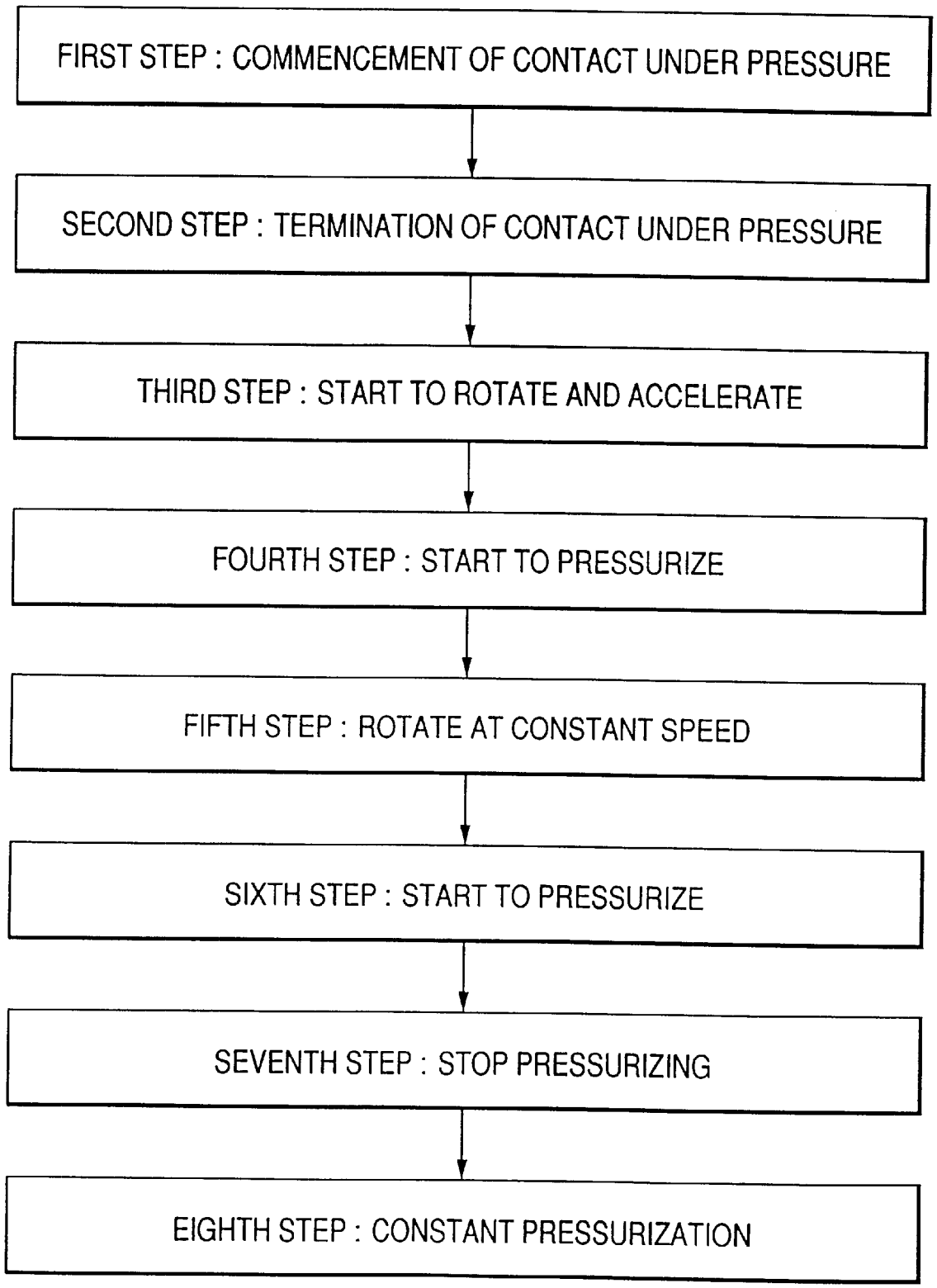
FIG. 3 is a flow chart showing a polishing method using the precise polishing apparatus according to the first embodiment of the present invention.

In a polishing method using the precise polishing apparatus according to the first embodiment, as shown in FIG. 3, the polishing pad 102 is urged against the wafer 100 on the wafer chuck 101 (contact under pressure; first step), and then the pressure of the polishing pad 102 urged against the wafer 100 is released (second step). Then, the polishing pad 102 and the wafer 100 start to be rotated and are accelerated (third step), and then the rotating polishing pad 102 is urged against the rotating wafer 100 with constant pressure. Then, the numbers of rotations of the polishing pad 102 and the wafer 100 which are urged against each other and are accelerated are selected to a predetermined value (fifth step), and the polishing pad 102 urged against the wafer 100 with the constant pressure starts to be pressurized against the wafer 100 with higher pressure greater than the constant pressure (sixth step). Then, the pressurization in which the polishing pad 102 is pressurized against the wafer 100 with the higher pressure is finished (seventh step), and then the polishing pad 102 continues to be urged against the wafer 100 with the higher pressure (eighth step).

Prior to the first step, the wafer (polished body) 100 is introduced into the precise polishing apparatus and is rested on the wafer chuck 101. Then, the polishing pad 102 and the wafer chuck 101 are positioned so that the polishing pad 102 is situated above the wafer 100.

In the first step, the polishing pad 102 is urged against the wafer 100 by the pressurizing means of the present invention. As a result the rear surface opposite to the polished surface of the wafer 100 is closely contacted with the backing film.

In the second step, the pressure of the polishing pad 102 urged against the wafer 100 is released by the pressurizing means 504 to establish a zero pressure condition in which the wafer is not substantially polished during the relative sliding movement.

In the third step, the polishing pad 102 and the wafer 100 are rotated. In this case, the number of rotations of the pad and the wafer are the same and these are rotated in the same direction. Further, in this case, the wafer 100 is not still polished during the relative sliding movement.

In the fourth step, the polishing pad 102 is urged against the wafer 100 by the pressurizing means of the present invention. As a result, the wafer 100 starts to be polished by the polishing pad 102. As the number of rotations is increased, a polished amount is increased accordingly.

In the fifth step, the number of rotations of the polishing pad 102 and the wafer 100 which are rotatingly accelerated are set to the predetermined value. As a result, the polished amount becomes constant. In this case, the number of rotations of the polishing pad and the wafer are the same.

In the sixth step, the pressure applied from the polishing pad 102 to the wafer 100 is increased, with the result that the polished amount is increased accordingly.

In the seventh step, the pressure applied from the polishing pad 102 to the wafer 100 is kept constant and the numbers of rotations of the polishing pad and the wafer are the same, with the result that the polished amount becomes constant.

A process for finishing the polishing is effected along the seventh, sixth, fifth, fourth, third, second and first steps in order.

As mentioned above, by using the polishing method according to the first embodiment, polishing unevenness can be prevented during the time period in which the pressure of the polishing pad urging the wafer becomes constant and the time period in which the numbers of rotations of the wafer chuck and the polishing pad become the same.

In the polishing method according to the first embodiment, timings for effecting the fifth to seventh steps can be altered appropriately.

[Second Embodiment]

Figure 4:
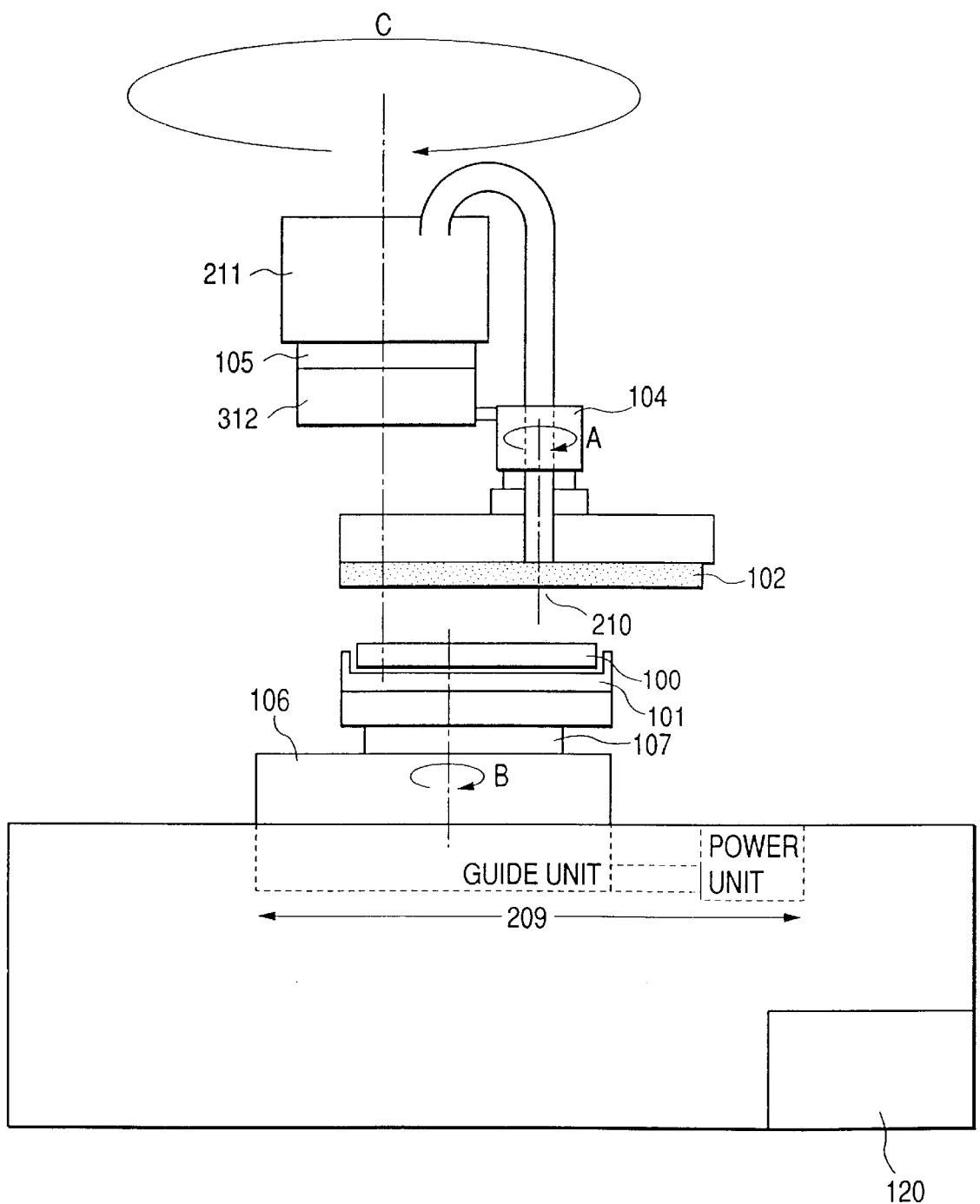
FIG. 4 is a schematic side view showing a wafer chuck and a drive means therefor of a chemical mechanical polishing apparatus according to a second embodiment of the present invention.

FIG. 4 is a schematic side view of a polishing head of a precise polishing apparatus according to a second embodiment of the present invention.

The second embodiment differs from the first embodiment only in the point that not only the polishing pad 102 is rotated around its axis in the direction A by the first drive means 104 but also the polishing pad is revolved around its axis in a direction shown by the arrow C by a fourth drive means 312. In this case, the revolution axis is positioned within the surface of the wafer 100 so that the wafer 100 does not project from the polishing pad 102 during the polishing. Also in this case, a radius of revolution and the oscillation range should be selected so that a sum of the distance between the rotation axes and the radius of the wafer becomes smaller than the radius of the pad.

In this case, there are four polishing methods. In the first polishing method, the number of rotations of the wafer 100, the number of rotations of the polishing pad 102 and the number of revolutions of the polishing pad are selected to be the same and, in the second polishing method, the number of rotations of the wafer 100 differs from the number of rotations of the polishing pad 102 and the number of revolutions of the polishing pad. In the second polishing method, the number of rotations and the number of revolutions of the polishing pad 102 are the same and the rotation and the revolution are effected in the same direction. In the third polishing method, the wafer 100 is polished by rotating and revolving the polishing pad 102 while not rotating the wafer 100. In this case, this precise polishing apparatus does not always need the second drive means 208. A fourth polishing method in which the polishing is effected by rotating the wafer 100 and by revolving the wafer by a revolution drive means (not shown) while not rotating the polishing pad 102 may be used. In this case, the first and fourth drive means 104, 312 may be omitted.

All of the above polishing methods are preferable. In the first to fourth polishing methods, the directions of the rotations (and revolutions) of the polishing pad 102 and the wafer are the same and the numbers of rotations (and revolutions) thereof are also the same. In case of the first polishing method, the number of rotation of the wafer 100 and the number of rotations and revolutions of the polishing pad 102 are selected within a range of 1000 rpm or less (same direction), and more preferably, 50 to 300 rpm (same direction).

In case of the second polishing method, a ratio between the number of rotations of the wafer 100 and the number of rotations and revolutions of the polishing pad 102 can be selected within a range of 1:0.5 to 1.5 and the number of rotations of the polishing pad 102 can be selected within a range of 1000 rpm or less. In this case, it is preferable that the wafer and the pad are rotated in the same direction.

In case of the third polishing method, as mentioned above, the number of rotations and revolutions of the polishing pad 102 are the same and are selected within a range of 1000 rpm or less (same direction), and more preferably, 50 to 300 rpm (same number).

Alternatively, the direction of the rotation of the polishing pad 102 may be opposite to the direction of the revolution of the polishing pad. In this case, it is preferable that the number of rotations and revolutions of the polishing pad 102 are the same and are selected within a range of several thousands of rpm, and more preferably, 50 to 300 rpm (same number).

Alternatively, the direction of the rotation of the polishing pad 102 may be opposite to the direction of the revolution of the polishing pad and at the same time the number of rotations may be differentiated from the number of revolutions by several rpm. In this case, the frequency that any portion of the polishing pad 102 is contacted with any portion of the wafer 100 can be averaged. This is particularly effective when the wafer is polished by using a polishing pad having a polishing surface provided with grid, concentric or radial grooves. That is to say, in this case, the pattern of the grooves of the polishing pad can be prevented from being transferred onto the surface of the wafer. Further, since polished matters and slurry fine particles can be prevented from being accumulated on the wafer 100, the scratch on the wafer can be prevented.

Incidentally, when the number of rotations is differentiated from the number of revolutions, the difference therebetween is preferably selected within a range between 1 rpm and several tens of rpm.

In the precise polishing apparatus according to the second embodiment, the rotation axis of the polishing pad and the rotation axis of the wafer may be positioned at gravity centers of the pad and the wafer, respectively, or, the rotation axes may be positioned eccentric from the gravity centers.

In the fourth polishing method, a direction of rotation of the wafer may be opposite to a direction of revolution of the wafer.

Further, in place of the fact that the wafer is oscillated by using the arrangement shown in FIG. 4, the third drive means 209 may be provided on the polishing head to oscillate the head, or, both the wafer and the head may be oscillated. In any cases, the oscillation range is selected as mentioned above.

[Third Embodiment]

Figure 6:
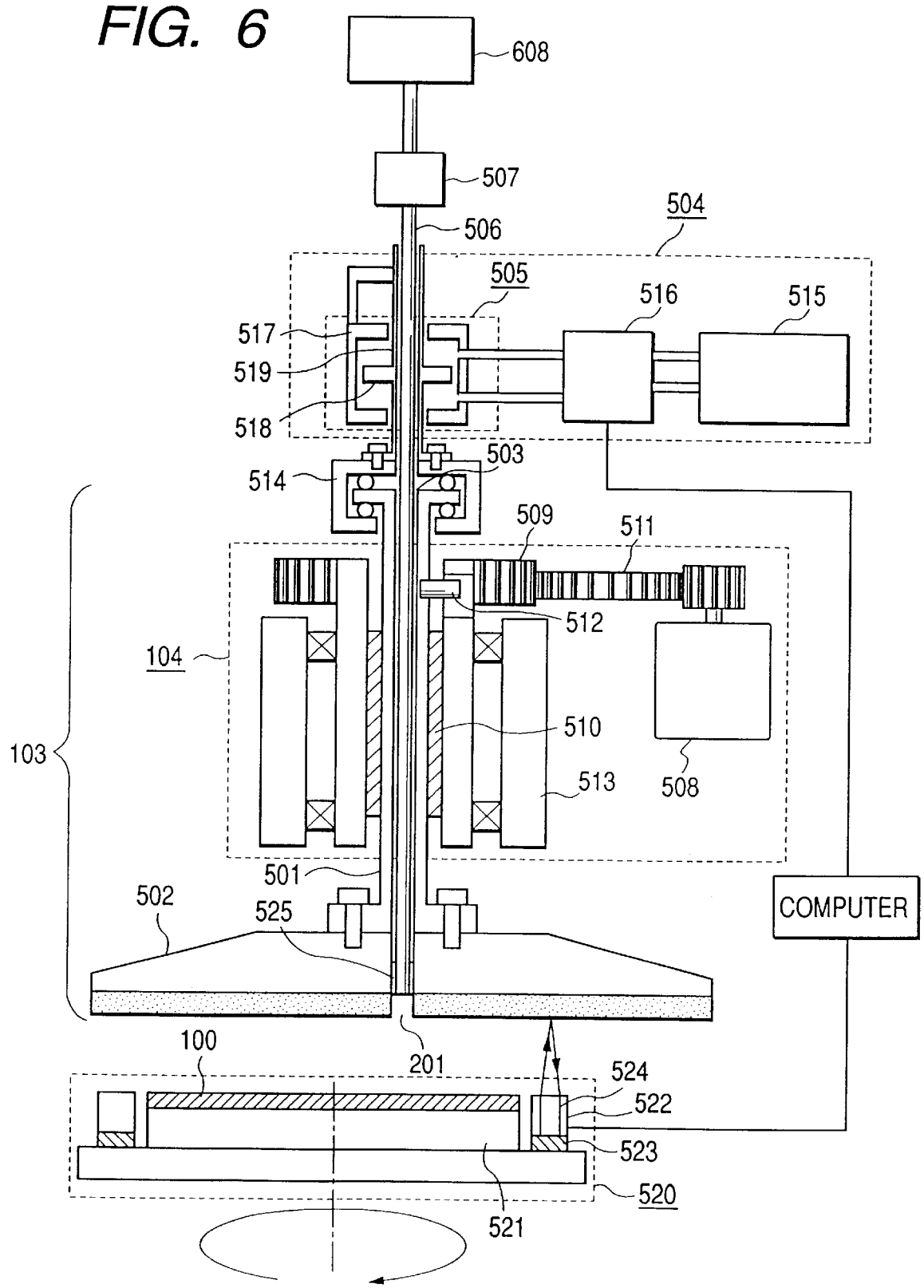
FIG. 6 is a schematic side view showing a wafer holding means and a polishing head of a precise polishing apparatus according to a third embodiment of the present invention.

FIG. 6 is a schematic view of a precise polishing apparatus according to a third embodiment of the present invention. The precise polishing apparatus according to the third embodiment comprises a polishing head 103, a first drive means 104 for rotating the polishing head, a distance measuring device 524 for measuring a distance between a polishing surface of a polishing pad 102 and a polished surface of a wafer 100, and a head lift/lower means 504 for shifting the polishing head in a vertical direction. The other constructions of the apparatus according to the third embodiment are the same as those in the first embodiment.

The polishing head 103 includes a rotation shaft 501 and a platen 502, and the platen 502 has an area greater than an area of the polishing pad 102 so that the platen can hold the polishing pad 102 having the area greater than that of the wafer 100. The platen 502 is rotated around the rotation shaft 501. A slurry supply passage 503 extends through centers of the shaft 501 and the platen 502. The slurry supply passage 503 further extends through a cylinder 505 constituting the head lift/lower means 504. A slurry supply tube 506 is disposed within the slurry supply passage 503 so that slurry can be supplied onto the polished surface of the wafer 100 through a small hole 201 formed in the platen 502. The slurry supply tube 506 is connected to a slurry supply tank 608 through a rotary joint 507. The slurry supply tube 506 disposed within the slurry supply passage 503 is rotated by the rotating force of the polishing head 103, but a portion of the slurry supply tube 506 between the rotary joint 507 and the slurry supply tank 608 is not rotated due to the presence of the rotary joint 507. As a result, stress due to torsion can be prevented from acting on the slurry supply tube 506, thereby preventing the damage of the slurry supply tube 506.

The polishing head 103 is rotated by the first drive means 104 and, as shown in FIG. 6, the first drive means 104 comprises a motor 508, a pulley 509, a sliding bearing 510, a belt 511 and a pin 512. The belt 511 is mounted on the motor 508 and the pulley 509 so that the rotating force of the motor 508 is transmitted to the pulley 509, thereby rotating the pulley 509. The belt is rotated together with the pulley 509. The sliding bearing 510 is disposed between a drive shaft 513 and the rotating shaft 501 of the polishing head to prevent the contact therebetween. The pin 512 is provided on the drive shaft 513. Thus, when the drive shaft 513 is rotated, the pin 512 is also rotated, with the result that the rotation shaft 501 of the polishing head is subjected to the rotating force from the rotating pin 512, thereby rotating the polishing head 103. The numbers of rotations of the polishing head 103 and the wafer 100 can be appropriately selected within a range of several thousands of rpm.

The polishing head 103 is connected to the head lift/lower means 504 through a thrust bearing 514. The thrust bearing 514 can prevent the head lift/lower means 504 from rotating as the polishing head 103 is rotated. The head lift/lower means 504 includes the cylinder 505, a pressurizing means 515 and a servo valve 516.

The cylinder 505 comprises a fluid holding part 517 and a cylinder shaft 519 having fins 518. The fluid holding part 517 is communicated with the pressurizing means 515 through the servo valve 516 via two tubes. The polishing head 103 is shifted in the vertical direction by sifting the fins 518 of the cylinder shaft 519 as fluid is supplied to or discharged from the fluid holding part 517 by the pressurizing means 515.

The servo valve 516 controls the pressure of the fluid supplied to the cylinder 505 from the pressurizing means 515 to correctly control the vertical movement of the polishing head 103.

The position of the polishing head 103 in the vertical direction is controlled by the head lift/lower means 504 with accuracy of several tens of $\mu$m. By increasing the pressure applied from the pressurizing means 515 to the fins 518 of the cylinder 505, the fins 518 are shifted downwardly, with the result that the pressure of the polishing pad 102 urged against the wafer 100 is increased accordingly.

A wafer holding means 520 comprises a backing film 521 for holding the rear surface opposite to the polished surface of the wafer 100, a guide ring 522 for surrounding the wafer 100, and a lower elastic member 523 for positioning the height of the guide ring 522 in flush with a level of the polished surface of the wafer 100.

The backing film 521 is formed from an elastic member made of polyurethane or the like and serves to hold the rear surface of the wafer 100 closely contacted with the backing film 521.

The guide ring 522 has an annular shape to surround and hold the wafer 100. As a result, even when the wafer 100 is rotated and/or slid, the wafer is prevented from shifting laterally.

The distance measuring device 524 for measuring the distance between the polishing surface of the polishing pad 102 and the polished surface of the wafer 100 is disposed within the guide ring 522. The distance measuring device 524 is opposed to the polishing surface of the polishing pad 102 and serves to measure the distance between the polishing surface of the polishing pad 102 and the polished surface of the wafer 100 by utilizing a laser reflection technique or an optical technique. A measured result from the distance measuring device 524 is processed by a computer and the like and then is fed back to the servo valve 516 to effect the pressure control of the fluid and is used as data for controlling the height position of the polishing head 103.

As mentioned above, in the precise polishing apparatus according to the third embodiment, by connecting the rotary joint 507 to the slurry supply tube 506, the portion of the slurry supply tube 506 between the rotary joint 507 and the slurry supply tank 608 can be prevented from being damaged and the polishing head 103 can be rotated stably at the high speed by the first drive means 104. Further, the contact pressure between the polishing pad 102 and the wafer 100 can be controlled by the pressurizing means 515. By feeding back the data regarding the distance between the polishing pad 102 and the wafer 100 (measured by the distance measuring device 524) to the head lift/lower means 504, the distance between the polishing surface of the polishing pad 102 and the polished surface of the wafer 100 can be set correctly.

In the precise polishing apparatus according to the third embodiment, the wafer 100 may be polished by rotating at least one of the polishing head 103 and the wafer holding means 520.

While an example that the distance measuring device 524 is disposed within the guide ring 522 was explained, the distance measuring device 524 may be disposed laterally so that the distance between the polishing surface of the polishing pad 102 and the polished surface of the wafer 100 can be measured from a lateral direction.

Preferably, a bearing (not shown) is provided on the slurry supply tube 506 disposed within the slurry supply passage 503. By providing the bearing on the slurry supply tube 506, the slurry supply tube 506 can be prevented from contacting with the rotating polishing head 103, with the result that the slurry supply tube 506 can be prevented from being rotated by the rotation of the polishing head 103. Consequently, the slurry supply tube 506 disposed within the slurry supply passage 503 is not subjected to stress due to torsion, so that the tube becomes hard to be damaged.

Further, it is preferable that a seal 525 is provided on the slurry supply tube 506 at its tip end portion. By providing the seal 525 on the tip end portion of the slurry supply tube 506, the slurry can be prevented from being spread between the slurry supply passage 503 and the slurry supply tube 506.

Next, a polishing method using the precise polishing apparatus according to the third embodiment will be explained.

In the polishing method using the precise polishing apparatus according to the third embodiment, the polishing pad 102 is urged against the wafer 100 on the wafer chuck 520 (contact under pressure), and then the polishing pad 102 is separated from the wafer 100 in a confronting relation, and a distance corresponding to half of a thickness of the wafer is set by using the distance measuring device 524 and, after the numbers of rotations of the polishing pad 102 and the wafer 111 reach the desired value, the polishing pad 102 is urged against the wafer 100 to polish the wafer 100.

The wafer 100 held by the backing film 521 is urged by the polishing pad 102 to closely contact with the backing film 521. At the same time, the guide ring 522 is urged by the polishing pad 102. In this case, the guide ring 522 is lowered by the presence of the lower elastic member 523, with the result that the guide ring becomes flush with the polished surface of the wafer 100.

In the illustrated embodiment, the distance between the polishing surface of the rotating polishing pad 102 and the polished surface of the wafer 100 which are spaced apart from each other in the confronting relation is set to a value smaller than half of the thickness of the wafer. As a result, the wafer 100 can be prevented form escaping out of the guide ring 522 before the predetermined number of rotations of the wafer is reached.

In the illustrated embodiment, after the desired number of rotations of the wafer 100 is reached, by urging the polishing pad 102 against the wafer to polish the latter, the wafer can be polished only by kinetic friction. As a result, polishing unevenness generated by static friction can be prevented from when the wafer is stationary to when the desired number of rotations of the wafer 100 is reached.

Figure 7:
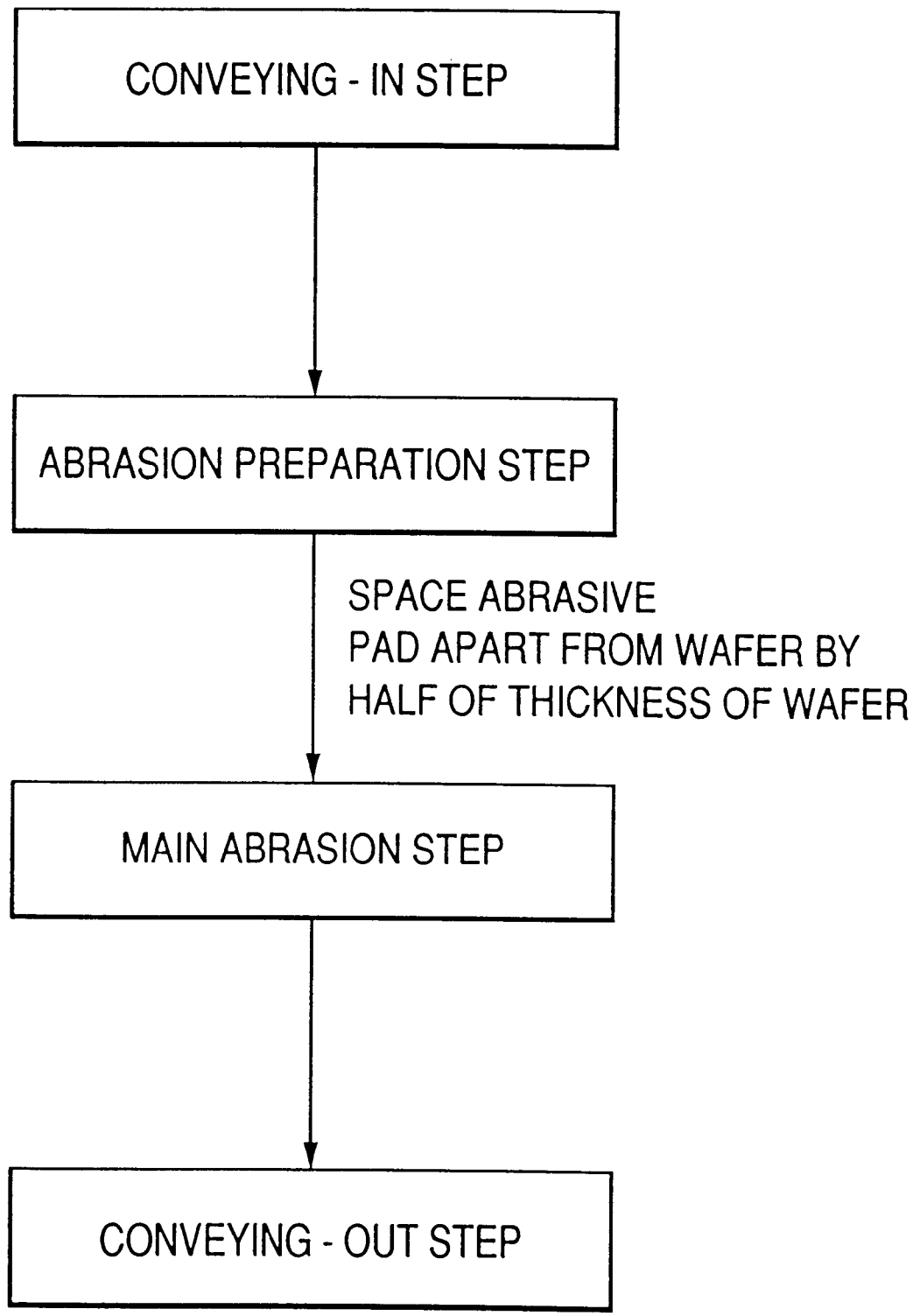
FIG. 7 is a flow chart showing a polishing method using the precise polishing apparatus according to the third embodiment of the present invention.

Now, the polishing method according to the illustrated embodiment will be explained with reference to FIG. 7.

The polishing method is divided into a conveying-in step for the wafer 100, a polishing (abrasion) preparation step, a main polishing (abrasion) step, and a conveying-out step.

Conveying-In Step

The wafer 100 is set on the wafer chuck 520 onto which the pure water is injected. Then, the polishing head 103 is shifted to be positioned above the wafer 100 set on the wafer chuck 520. In this way, the conveying-in step is finished.

Abrasion Preparation Step

After the conveying-in step is finished, the abrasion preparation step is started. In the abrasion preparation step, before the polishing operation is started, polishing conditions (polishing time, polishing pressure, number of rotations of the polishing head, and distance between the polishing surface of the polishing pad and the polished surface of the wafer) are set. After the polishing conditions were set, the pure water is supplied to the polished surface of the wafer 100 from the small hole 201 formed in the polishing head 103 through the polishing pad 102.

The polishing head 103 is shifted in the vertical direction by the head lift/lower means 504 while supplying the pure water to the wafer 100, so that the polishing pad 102 is urged against the entire polished surface of the wafer, thereby holding down the wafer 100 with predetermined pressure. Consequently, the polished surface of the wafer 100 becomes flush with the upper surface of the guide ring.

After the wafer 100 is held down, the polishing pad 102 is separated from the wafer 100 by shifting the polishing head 103 upwardly by the head lift/lower means 504. In this case, the distance between the polishing surface of the polishing pad 102 and the polished surface of the wafer 100 is maintained to the distance previously set in the abrasion preparation step, which prevents the wafer 100 from escaping from the guide ring by the rotation of the wafer. Such a distance is smaller than half of the thickness of the wafer 100 (when the thickness of the wafer is 676 $\mu$m, the distance is 338 $\mu$m or less).

Main Abrasion Step

After the polishing pad 102 is separated from the wafer 100, the polishing pad 102 and the wafer chuck 520 start to be rotated. It is always monitored whether the number of rotations is included within the predetermined range.

During the rotation, the slurry is supplied onto the wafer 100 from the small hole 201 formed in the polishing head 103 through the polishing pad 102.

It is judged whether the number of rotations reaches to the predetermined value. If the number of rotations does not reach to the predetermined value, the number of rotations is set again until the predetermined number of rotations is attained.

The polishing pad 102 held by the polishing head 103 is urged against the wafer 100 held on the wafer chuck 520. Also in this case, the slurry is supplied between the polishing pad 102 and the wafer 100 which are contacted with each other.

The wafer 100 is polished while increasing the numbers of rotations of the rotating wafer 100 and the polishing pad 102.

After the polishing pad 102 and the wafer 100 are rotated at the high speed, the wafer chuck 520 is oscillated to effect oscillating/sliding abrasion, thereby improving the uniformity of the abrasion.

Then, in order to achieve the surface reference abrasion, the pressure of the polishing pad 102 urged against the wafer 100 is increased. More specifically, the polishing head 103 is lowered by the cylinder 505.

After a predetermined time period is elapsed, the pressure of the polishing pad 102 urged against the wafer 100 is decreased. Then, the oscillation is stopped. After the oscillation is stopped, the rotational speed is decreased to achieve the predetermined number of rotations. In this case, the supplying of the slurry to the wafer 100 is stopped, and the pure water is supplied onto the wafer 100.

Then, the polishing pad 102 is separated from the wafer 100. In this case, the distance between the polishing surface of the polishing pad 102 and the polished surface of the wafer 100 is selected to become smaller than the half of the thickness of the wafer 100 as mentioned above. And then, the rotations of the wafer 100 and the polishing pad 102 which are separated from each other are stopped.

Then, the wafer 100 is brought to a cleaning means, where the surface of the wafer is cleaned, and then the wafer is sent to the conveying-out step, where the wafer is discharged out of the apparatus. In this way, the polishing method is finished.

[Fourth Embodiment]

Figure 8:
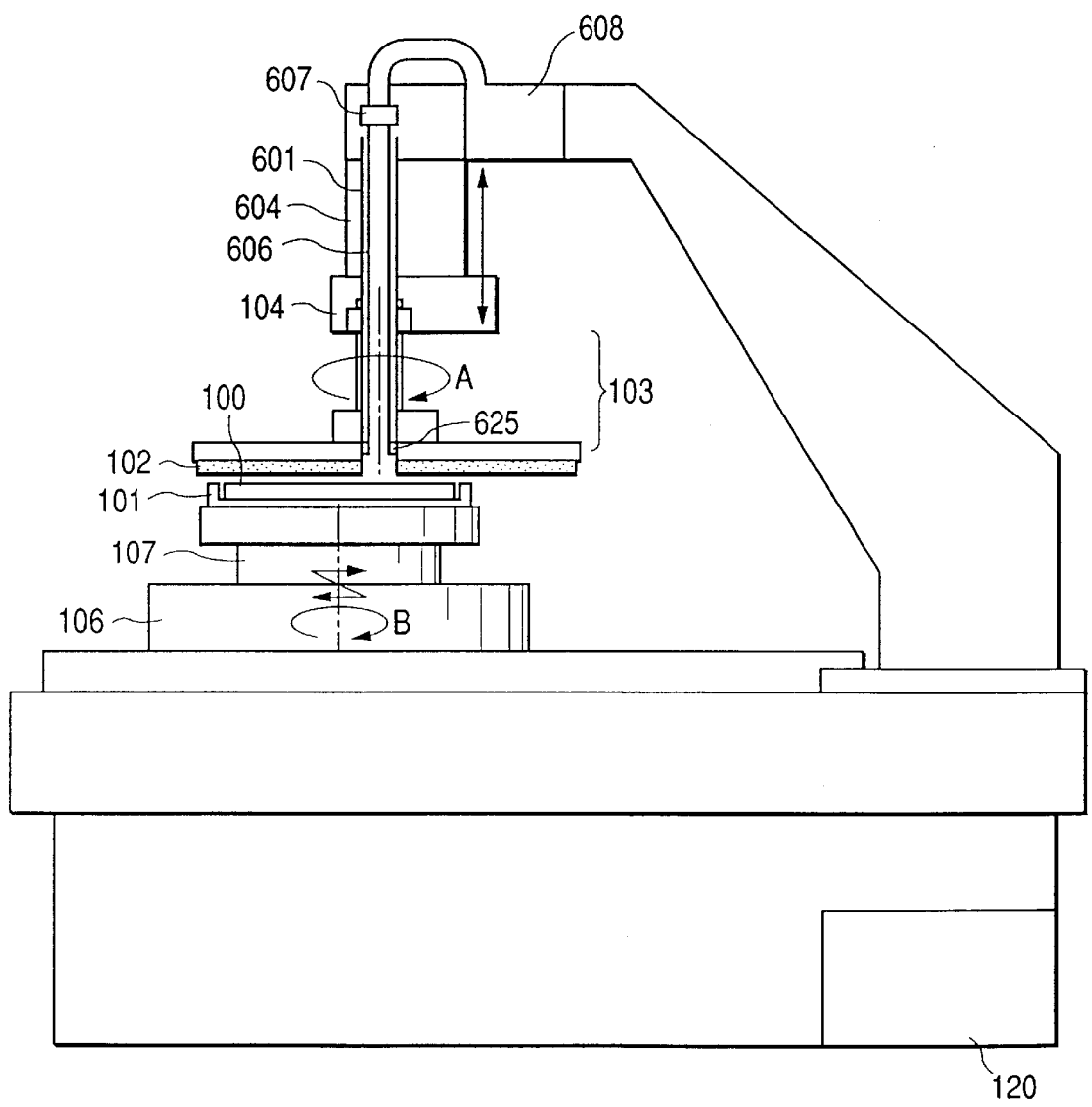
FIG. 8 is a schematic side view of a precise polishing apparatus according to a fourth embodiment of the present invention.

FIG. 8 is a schematic view showing a polishing head 103 and a wafer chuck (wafer holding means) 101 of a precise polishing apparatus according to a fourth embodiment of the present invention. The polishing apparatus according to the fourth embodiment comprises a polishing head 103, a first drive means 104 for rotating the polishing head 103, and a revolution shaft body 604 for revolving the polishing head 103, and a slurry supply tube 606 disposed within a rotational shaft of the polishing head 103 is connected to a slurry supply tank 608 via a rotary joint 607. The other constructions are the same as those in the first embodiment.

As shown in FIG. 8, the polishing head 103 is revolved by the revolution shaft body 604 and is rotated by the first drive means 104. The number of revolutions and the number of rotations can be set independently.

A direction of the rotation of the polishing head 103 is opposite to a direction of the revolution thereof.

The rotation shaft 601 of the polishing head 103 extending through the revolution shaft body 604 is connected to the slurry supply tank 608 via the rotary joint 607. Thus, the slurry supply tube 606 disposed within the polishing head 103 is rotated, but, a portion of the slurry supply tube 606 between the rotary joint 607 and the slurry supply tank 608 is not influenced by the rotation of the polishing head 103.

Since the polishing head 103 according to the illustrated embodiment is rotated and revolved in opposite directions, stress acting on the slurry supply tube 606 can be reduced. For example, if it is assumed that the number of rotations is set to 100 rpm, the number of revolutions is set to 99 rpm and the direction of the rotation is opposite to the direction of the revolution, seemingly, only the stress corresponding to 1 rpm acts on the slurry supply tube 606 in the rotation direction. Thus, since the damage of the slurry supply tube 606 can be prevented, the slurry can be supplied to the wafer 100 for a long term.

In the precise polishing apparatus according to the illustrated embodiment, preferably, a bearing (not shown) is provided on the slurry supply tube 606 disposed within the slurry supply passage 603. By providing the bearing on the slurry supply tube 606, the slurry supply tube 606 can be prevented from contacting with the rotating polishing head 103, with the result that the slurry supply tube 606 can be prevented from being rotated together with the polishing head 103. Further, it is preferable that a seal 625 is provided on the slurry supply tube 606 at its tip end portion. By providing the seal 625 on the tip end portion of the slurry supply tube 606, the slurry can be prevented from being spread between the slurry supply passage 603 and the slurry supply tube 606.

In the precise polishing apparatus according to the illustrated embodiment, at least one of the first drive means 104 for rotating the polishing head 103 and a revolution drive means (not shown) for revolving the polishing head may be provided with a hollow motor and the slurry supply tube 606 may be disposed within a hollow portion of the hollow motor. With this arrangement, the drive means for rotation the polishing head 103 can be made compact, and, accordingly, the entire precise polishing apparatus can be made compact.

[Fifth Embodiment]

Figure 9:
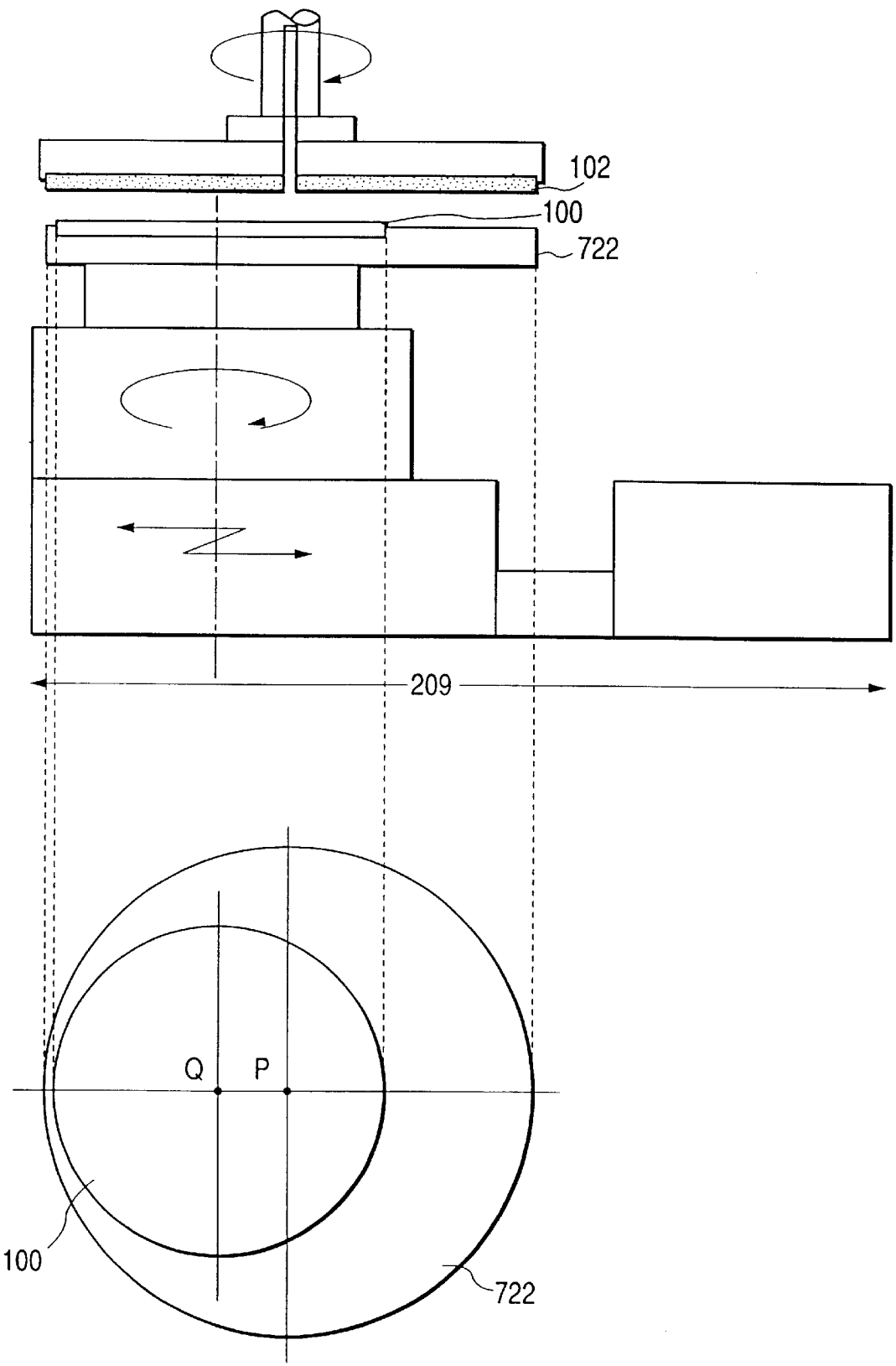
FIG. 9 is a schematic side view showing a wafer chuck of a precise polishing apparatus according to a fifth embodiment of the present invention.
Figure 10:
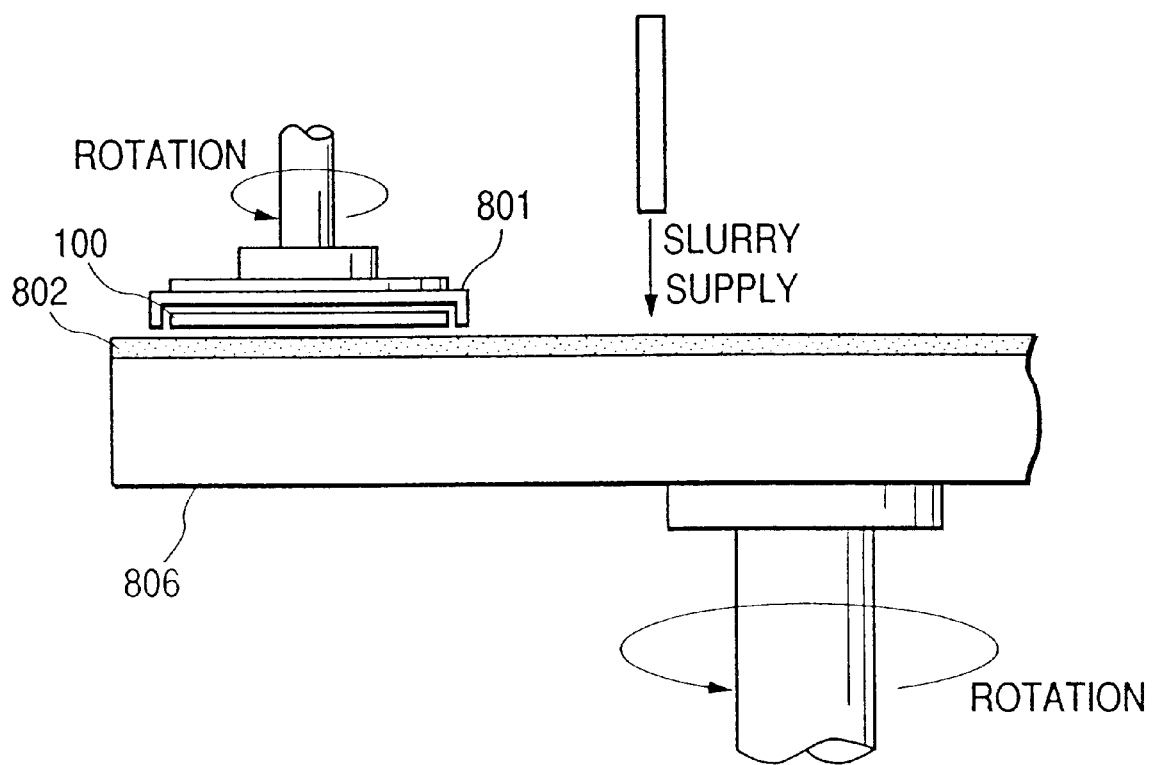
FIG. 10 is a schematic side view showing a polishing portion of a conventional chemical mechanical polishing apparatus.
Figure 11:
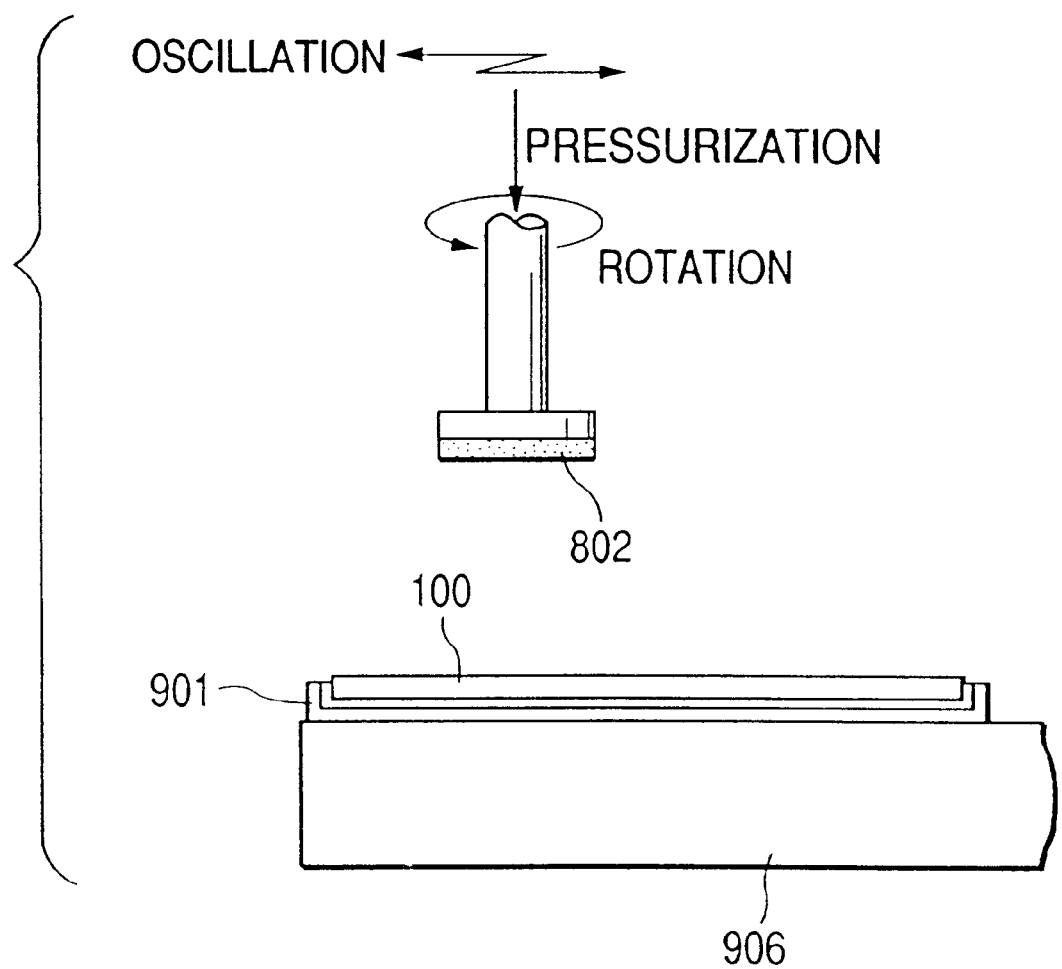
FIG. 11 is a schematic side view showing a polishing portion of another conventional chemical mechanical polishing apparatus.

FIG. 9 is a schematic view showing a guide ring 722 of a precise polishing apparatus according to a fifth embodiment of the present invention. In the fifth embodiment, the guide ring is a part of a polished body holding means and a diameter of the guide ring 722 is greater than a diameter of a polishing pad 102. The other constructions are the same as those in the first embodiment.

The guide ring 722 has a space for holding the wafer 100. A center of the space is deviated from a center of the guide ring 722. The space has a diameter capable of holding the wafer 100. A sum of the maximum distance between a center of the guide ring 722 and a center of the polishing pad 102 and a diameter of the polishing pad 102 is determined to be less than a diameter of the guide ring 722.

The polishing is effected by rotating the wafer 100 and the polishing pad 102 while not rotating the guide ring 722.

In the illustrated embodiment, during the polishing, the guide ring 722 is contacted with the entire surface of the polishing pad 102. In this case, because the pressure is uniformly added to the whole area of the polished pad, a thickness of the polishing pad 102 becomes uniform through the entire area thereof. Thus, the wafer 100 can be polished uniformly.

Further, in the illustrated embodiment, the wafer 100 held by the guide ring 722 can be revolved by rotating the guide ring 722.

According to the present invention, the uniform polished amount can be obtained in the entire polished area. Thus, yield is improved and the cost is reduced. Further, by using the polishing pad having the diameter greater than that of the wafer, the large diameter wafer or display wafer (such as 12-inch wafer) can be polished for a short time. Since the abrasive agent is supplied to the wafer with the polished surface thereof facing upwardly, the consumption of the abrasive agent can be reduced, thereby reducing the polishing cost.

What is claimed is:

1. A precise polishing apparatus comprising:

polished body holding means for holding a polished body with a polished surface thereof facing upwardly and for enabling to rotate the polished body around a center of the polished surface;

a polishing head for holding a polishing pad having a diameter greater than a diameter of the polished body with a polishing surface thereof facing downwardly and for rotating and revolving said polishing pad around a center of the polishing surface; and a supply opening provided in said polishing head and adapted to supply abrasive agent to the polished surface via said polishing pad, wherein the polishing is effected in conditions that a rotation axis of the polished body is deviated from a rotation axis of said polishing pad and that said polishing pad contacts an entire area of the polished surface of the polished body.

2. A precise polishing apparatus comprising:

polished body holding means for holding a polished body with a polished surface thereof facing upwardly and for enabling to rotate the polished body around a center of the polished surface;

a polishing head for holding a polishing pad having a diameter greater than a diameter of the polished body with a polishing surface thereof facing downwardly and for rotating and revolving said polishing pad around a center of the polishing surface; and a supply opening provided in a said polishing head and adapted to supply abrasive agent to the polished surface via said polishing pad, wherein said polished body holding means includes drive means for oscillating the polished body in directions along the polished surface, and a sum of a maximum value of a distance between the center of the polished body and the center of said polishing pad generated due to the oscillation and a radius of the polished body is selected to become smaller than a radius of said polishing pad.

3. A precise polishing apparatus comprising:

polished body holding means for holding a polished body with a polished surface thereof facing upwardly and for enabling to rotate the polished body around a center of the polished surface;

a polishing head for holding a polishing pad having a diameter greater than a diameter of the polished body with a polishing surface thereof facing downwardly and for rotating and revolving said polishing pad around a center of the polishing surface; and a supply opening provided in said polishing head and adapted to supply abrasive agent to the polished surface via said polishing pad, wherein said polishing head includes drive means for oscillating the polished body in directions along polished surface, and a sum of a maximum value of a distance between the center of the polished body and the center of said polishing pad generated due to the oscillation and a radius of the polished body is selected to become smaller than a radius of said polishing pad.

4. A precise polishing method using a precise polishing apparatus comprising polished body holding means for holding a polished body with a polished surface thereof facing upwardly and for enabling to rotate the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, the method comprising the step of:

polishing the body in conditions that a rotation axis of the polished body is deviated from a rotation axis of the polishing pad and that the polishing pad contacts an entire area of the polished surface of the polished body.

5. A precise polishing method using a precise polishing apparatus comprising polished body holding means for holding a polished body with a polished surface thereof facing upwardly and for enabling to rotate the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, the method comprising the step of:

oscillating the polished body along the polished surface, wherein a sum of a maximum value of a distance between the center of the polished body and the center of the polishing pad generated due to the oscillation and a radius of the polished body is selected to become smaller than a radius of the polishing pad.

6. A precise polishing method using a precise polishing apparatus comprising polished body holding means for holding a polished body with a polished surface thereof facing upwardly and for enabling to rotate the polished body around a center of the polished surface, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, the method comprising the step of:

oscillating the polishing pad along the polished surface, wherein a sum of a maximum value of a distance between the center of the polished body and the center of the polishing pad generated due to the oscillation and a radius of the polished body is selected to become smaller than a radius of said polishing pad.

7. A precise polishing apparatus according to claim 1, 2 or 3, wherein the polished body comprises a semi-conductor wafer.

8. A precise polishing apparatus according to claim 1, 2 or 3, wherein said polished body holding means includes an equalizing mechanism for urging the polished body against the polished pad with uniform pressure.

9. A precise polishing apparatus according to claim 1, 2, or 3, wherein a ratio between the number of rotations of the polished body and the number of rotations of said polishing pad is selected within a range of 1:0.5 to 1.5.

10. A precise polishing apparatus according to claim 1, 2, or 3, wherein the number of rotations of the polished body and the number of rotations of said polishing pad are the same.

11. A precise polishing apparatus according to claim 1, 2 or 3, wherein the diameter of said polishing pad is smaller than twice of the diameter of said polished body.

12. A precise polishing apparatus according to claim 2 or 3, wherein the oscillation is a reciprocal linear movement.

13. A precise polishing apparatus according to claim 2 or 3, wherein the oscillation is a reciprocal arc movement.

14. A precise polishing apparatus comprising:

polished body holding means for holding a polished body with a polished surface thereof facing upwardly and for enabling to rotate and revolve the polished body around a center of the polished surface;

a polishing head for holding a polishing pad having a diameter greater than a diameter of the polished body with a polishing surface thereof facing downwardly; and a supply opening provided in said polishing head and adapted to supply abrasive agent to the polished surface via said polishing pad, wherein the polishing is effected in conditions that a rotation axis of the polished body is deviated from an axis of said polishing pad and that said polishing pad is contacted with an entire area of the polished surface of the polished body.

15. A precise polishing apparatus comprising:

polished body holding means for holding a polished body with a polished surface thereof facing upwardly and for enabling to rotate and revolve the polished body around a center of the polished surface;

a polishing head for holding a polishing pad having a diameter greater than a diameter of the polished body with a polishing surface thereof facing downwardly; and a supply opening provided in said polishing head and adapted to supply abrasive agent to the polished surface via said polishing pad, wherein said polishing body holding means includes drive means for oscillating the polished body in directions along the polished surface, and a sum of a maximum value of a distance between the center of the polished body and the center of said polishing pad generated due to the oscillation and a radius of the polished body is selected to become smaller than a radius of said polishing pad.

16. A precise polishing apparatus comprising:

polished body holding means for holding a polished body with a polished surface thereof facing upwardly and for enabling to rotate and revolve the polished body around a center of the polished surface;

a polishing head for holding a polishing pad having a diameter greater than a diameter of the polished body with a polishing surface thereof facing downwardly; and a supply opening provided in said polishing head and adapted to supply abrasive agent to the polished surface via said polishing pad, wherein said polishing head includes drive means for oscillating the polished body in directions along the polished surface, and a sum of a maximum value of a distance between the center of the polished body and the center of said polishing pad generated due to the oscillation and a radius of the polished body is selected to become smaller than a radius of said polishing pad.

17. A precise polishing method using a precise polishing apparatus comprising polished body holding means for holding a polished body with a polished surface thereof facing upwardly and for enabling to rotate and revolve the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, the step comprising:

polishing the body in conditions that a rotation axis of the polished body is deviated from an axis of the polishing pad and that the polishing pad is contacted with an entire area of the polished surface of the polished body.

18. A precise polishing method using a precise polishing apparatus comprising polished body holding means for holding a polished body with a polished surface thereof facing upwardly and for enabling to rotate and revolve the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, the method comprising the step of:

oscillating the polished body along the polished surface, wherein a sum of a maximum value of a distance between the center of the polished body and the center of the polishing pad generated due to the oscillation and a radius of the polished body is selected to become smaller than a radius of the polishing pad.

19. A precise polishing method using a precise polishing apparatus comprising polished body holding means for holding a polished body with a polished surface thereof facing upwardly and for enabling to rotate and revolve the polished body around a center of the polished surface, a polishing head for holding a polishing pad having a diameter greater than a diameter of the polished body with a polishing surface thereof facing downwardly, and a supply opening provided in the polishing head and adapted to supply abrasive agent to the polished surface via the polishing pad, the method comprising the step of:

oscillating the polishing pad along the polished surface, wherein a sum of a maximum value of a distance between the center of the polished body and the center of the polishing pad generated due to the oscillation and a radius of the polished body is selected to become smaller than a radius of the polishing pad.

20. A precise polishing apparatus according to claim 14, 15 or 16, wherein the polished body comprises a semiconductor wafer.

21. A precise polishing apparatus according to claim 14, 15 or 16, wherein said polished body holding means includes an equalizing mechanism for urging the polished body against said polishing pad with uniform pressure.

22. A precise polishing apparatus according to claim 14, 15 or 16, further comprising a drive means for rotating said polishing pad, and wherein a ratio between the number of rotations of the polished body and the number of rotations of said polishing pad is selected within a range of 1:0.5 to 1.5.

23. A precise polishing apparatus according to claim 14, 15 or 16, further comprising a drive means for rotating said polishing pad, and wherein the number of rotations of the polished body and the number of rotations of said polishing pad is the same.

24. A precise polishing apparatus according to claim 14, 15 or 16, wherein the diameter of said polishing pad is smaller than twice of the diameter of the polished body.

25. A precise polishing apparatus according to claim 15 or 16, wherein the oscillation is a reciprocal linear movement.

26. A precise polishing apparatus according to claim 15 or 16, wherein the oscillation is a reciprocal arc movement.

27. A precise polishing apparatus according to claim 1, 2, 3, 14, 15 or 16, further comprising a distance measuring means for measuring a distance between said polishing pad and the polished body which are opposed to each other.

28. A precise polishing apparatus according to claim 1, 2, 3, 14, 15 or 16, further comprising a drive means for revolving said polishing head in a direction opposite to the rotational direction of said polishing head.

29. A precise polishing apparatus according to claim 1, 2, 3, 14, 15 or 16, wherein a sum of a distance between the center of said polishing pad and the center of the polished body and a radius of the polished body is selected to become smaller than a radius of said polishing pad.

30. A precise polishing apparatus according to claim 1, 2, 3, 14, 15 or 16, wherein said supply opening is positioned at an end of a slurry supply passage passing through the rotational axis of said polishing head.

31. A precise polishing apparatus according to claim 30, further comprising a rotary joint for connecting a first slurry supply tube disposed in said slurry supply passage with a second slurry supply tube connected to a slurry supply tank.

32. A precise polishing apparatus according to claim 30, wherein said slurry supply passage passing through the rotational axis of said polishing head extends through a revolution shaft body for revolving said polishing head.

33. A precise polishing apparatus according to claim 1, 2, 3, 14, 15 or 16, wherein a diameter of said polished body holding means is greater than the diameter of said polishing pad.

34. A precise polishing apparatus according to claim 33, wherein said polished body holding means holds the polished body in such a manner that the center of the polished body is deviated from a center of said polished body holding means.

35. A precise polishing apparatus according to claim 34, wherein a sum of a maximum distance between the center of the polishing pad and the center of said polished body holding means and a radius of the polishing pad is selected to become smaller than a radius of guide ring which is a part of said polished body holding means.

36. A precise polishing method according to claim 4, 5, 6, 17, 18 or 19, wherein the rotational direction and the revolving direction of the rotating and revolving polishing pad are opposite to each other.

37. A precise polishing method according to claim 4, 5, 6, 17, 18 or 19, wherein the polishing pad is disposed above and opposed to the rotating polished body with a gap having a value of a half of a thickness of the polished body, and the polishing pad is contacted with the polished body after acceleration of rotation of the polished body is stopped to rotate the polished body at a constant speed.

38. A precise polishing method according to claim 4, 5, 6, 17, 18 or 19, wherein a sum of a distance between the center of the polishing pad and the center of the polished body and a radius of the polished body is selected to become smaller than a radius of the polishing pad.

39. A precise polishing method according to claim 38, wherein the entire surface of the polishing pad is urged against the polishing body holding means holding the polished body to polish the polished by the polishing pad.

40. A precise polishing method according to claim 39, wherein the polished body holding means holds the polished body in such a manner that the center of the polished body is deviated from a center of the polished body holding means.

41. A precise polishing method according to claim 40, wherein a maximum sum of a distance between the center of the polishing pad and the center of the holding means and a radius of the polishing pad is selected to become smaller than a radius of guide ring which is a part of the polished body holding means.

42. A precise polishing apparatus comprising:

polished body holding means for holding a polished body with a polished surface thereof facing upwardly;

a polishing head for holding a polishing pad having a diameter greater than a diameter of the polished body with a polishing surface thereof facing downwardly and for rotating and revolving said polishing pad around a center of the polishing surface; and a supply opening provided in said polishing head and adapted to supply abrasive agent to the polished surface via said polishing pad, wherein the polishing is effected in conditions that a rotation axis of the polished body is deviated from a rotation axis of said polishing pad and that said polishing pad is contacted with an entire area of the polished surface of the polished body.

43. A precise polishing apparatus according to claim 42, wherein a ratio between the number of rotations of said polishing pad and the number of revolutions of said polishing pad is selected with a range of 1:0.5 to 1.5.

44. A precise polishing apparatus according to claim 42, wherein the diameter of the polishing pad is smaller than twice the diameter of said polished body.

45. A precise polishing method using a precise polishing apparatus comprising polished body holding means for holding a polished body with a polished surface thereof facing upwardly, a polishing head for holding a polishing pad having a diameter greater than a diameter of the polished body with a polishing surface thereof facing downwardly and for rotating and revolving the polishing pad around a center of the polishing surface, and a supply opening provided in the polishing head and adapted to supply abrasive agent to the polished surface via the polishing pad, the method comprising the step of:

polishing the body in conditions that a rotation axis of the polished body is deviated from a rotation axis of the polishing pad and that the polishing pad contacts an entire area of the polished surface of the polished body.

46. A precise polishing method according to claim 45, wherein a ratio between the number of rotations of the polishing pad and the number of revolutions of the polishing pad is selected within a range of 1:0.5 to 1.5.

47. A precise polishing method according to claim 45, wherein the diameter of the polishing pad is smaller than twice the diameter of said polished body.

48. A precise polishing method according to claim 45, wherein a direction of rotation of said polishing pad is opposite to a direction of revolution of said polishing pad.

* * * * *

UNITED STATES PATENT AND TRADEMARK OFFICE
CERTIFICATE OF CORRECTION

PATENT NO.    : 6,629,882 B2
DATED         : October 7, 2003
INVENTOR(S)   : Kazuo Takahashi et al.

It is certified that error appears in the above-identified patent and that said Letters Patent is hereby corrected as shown below:

Column 11,
Line 63, "numbers" should read -- number --.

Column 12,
Lines 42 and 52, "numbers" should read -- number --.

Column 15,
Line 1, "numbers" should read -- number --.

Column 16,
Line 53, "form" should read -- from --.

Column 19,
Line 4, "rotation" should read -- rotating --.

Column 24
Lines 9 and 40, "guide" should read -- a guide --.
Line 30, "polished" should read -- polished body --.

Signed and Sealed this

Thirtieth Day of December, 2003

JAMES E. ROGAN
*Director of the United States Patent and Trademark Office*